(12) United States Patent
Liu et al.

(10) Patent No.: US 12,199,758 B2
(45) Date of Patent: Jan. 14, 2025

(54) PASSIVE OPTICAL NETWORK (PON) FRAME DESIGN

(71) Applicant: Huawei Technologies Co., Ltd., Shenzhen (CN)

(72) Inventors: Xiang Liu, Marlboro, NJ (US); Frank Effenberger, Plano, TX (US); Linlin Li, Morganville, NJ (US); Huaiyu Zeng, Red Bank, NJ (US); Yuanqiu Luo, Cranbury, NJ (US)

(73) Assignee: Huawei Technologies Co., Ltd., Shenzhen (CN)

( * ) Notice: Subject to any disclaimer, the term of this patent is extended or adjusted under 35 U.S.C. 154(b) by 378 days.

(21) Appl. No.: 17/449,790

(22) Filed: Oct. 1, 2021

(65) Prior Publication Data
US 2022/0021481 A1    Jan. 20, 2022

Related U.S. Application Data

(63) Continuation of application No. PCT/CN2020/082829, filed on Apr. 1, 2020.

(60) Provisional application No. 62/827,598, filed on Apr. 1, 2019.

(51) Int. Cl.
*H04L 1/00* (2006.01)
*H04B 10/50* (2013.01)
*H04B 10/66* (2013.01)

(52) U.S. Cl.
CPC .......... *H04L 1/0061* (2013.01); *H04B 10/50* (2013.01); *H04B 10/66* (2013.01)

(58) Field of Classification Search
CPC ..... H04L 1/0061; H04L 1/0057; H04B 10/50; H04B 10/66; H04B 10/2725; H04B 10/272; H04B 10/07953; H04B 10/5055; H03M 13/11; H03M 13/1102; H03M 13/1191; H03M 13/1148; H03M 13/1151;
(Continued)

(56) References Cited

U.S. PATENT DOCUMENTS

| 9,209,897 | B2 | 12/2015 | Amitai et al. |
| 9,413,484 | B2 * | 8/2016 | Luo .................. H04J 14/0227 |
| 2005/0005189 | A1 | 1/2005 | Khermosh et al. |

(Continued)

FOREIGN PATENT DOCUMENTS

| CN | 1625859 A | 6/2005 |
| CN | 102007712 A | 4/2011 |

(Continued)

OTHER PUBLICATIONS

"Amendment 9: Physical Layer Specifications and Management Parameters for 25Gb/s and 50 GB/s Passive Optical Network," IEEE Standard for Ethernet, Jul. 3, 2020, 267 pages.

(Continued)

*Primary Examiner* — Hibret A Woldekidan
(74) *Attorney, Agent, or Firm* — Conley Rose, P.C.

(57) ABSTRACT

A method comprises generating a PON frame comprising a plurality of FEC codewords, the FEC codewords comprise a first codeword, and the first codeword comprises a PSB; and transmitting the PON frame. A method comprises receiving a PON frame comprising a plurality of FEC codewords, the FEC codewords comprise a first codeword, and the first codeword comprises a PSB; and processing the PON frame.

20 Claims, 4 Drawing Sheets

(58) Field of Classification Search
CPC ......... H03M 13/1154; H03M 13/1157; H03M 13/1162; H03M 13/1165; H03M 13/116
See application file for complete search history.

(56) References Cited

U.S. PATENT DOCUMENTS

| | | |
|---|---|---|
| 2006/0256846 A1 | 11/2006 | Oksman et al. |
| 2007/0157060 A1 | 7/2007 | Ganga et al. |
| 2009/0276681 A1 | 11/2009 | Ou |
| 2011/0142437 A1 | 6/2011 | Luo et al. |
| 2013/0272706 A1* | 10/2013 | Luo .................. H04B 10/27 398/66 |
| 2014/0307734 A1 | 10/2014 | Luby et al. |
| 2015/0214981 A1 | 7/2015 | Prodan |
| 2015/0263805 A1 | 9/2015 | Shrikhande |
| 2015/0381313 A1* | 12/2015 | Khotimsky .......... H03M 13/35 714/776 |
| 2016/0013811 A1 | 1/2016 | Si et al. |
| 2018/0077475 A1 | 3/2018 | Ye et al. |
| 2018/0278270 A1* | 9/2018 | Si .................... H03M 13/17 |
| 2019/0158220 A1 | 5/2019 | Gao et al. |

FOREIGN PATENT DOCUMENTS

| | | |
|---|---|---|
| CN | 105027451 A | 11/2015 |
| CN | 109478947 A | 3/2019 |
| EP | 2499770 A1 | 9/2012 |
| JP | 2016521494 A | 7/2016 |
| JP | 2016523037 A | 8/2016 |
| JP | 2019012989 A | 1/2019 |
| KR | 101506207 B1 | 3/2015 |
| RU | 2531874 C2 | 10/2014 |
| WO | 2014040247 A1 | 3/2014 |
| WO | 2014063656 A1 | 5/2014 |
| WO | 2017113349 A1 | 7/2017 |

OTHER PUBLICATIONS

"Series G: Transmission Systems and Media, Digital Systems and Networks, Digital Sections and Digital Line System—Optical line systems for local and access networks, 10-Gigabit-capable passive optical networks (XG-PON): Transmission convergence (TC) layer specification," ITU-T, G.987.3, Jan. 2014, 146 pages.

"Series G: Transmission Systems and Media, Digital Systems and Networks, Digital Sections and Digital Line System—Optical line systems for local and access networks, 10-Gigabit-capable passive optical networks (XG-PON): Transmission convergence (TC) layer specification, Amendment 1," ITU-T, G.987.3, Amendment 1, Mar. 2020, 145 pages.

"Series G: Transmission Systems and Media, Digital Systems and Networks, Digital Sections and Digital Line System—Optical line systems for local and access networks, 10-Gigabit-capable passive optical networks (XG-PON): Transmission convergence (TC) layer specification, Amendment 2," ITU-T, G.987.3, Amendment 2, May 2021, 150 pages.

"Series G: Transmission Systems and Media, Digital Systems and Networks, Digital sections and digital line system—Optical line systems for local and access networks, Gigabit-capable passive optical networks (G-PON): Transmission convergence layer specification," Recommendation ITU-T G.984.3, XP044008605, Jan. 2014, 170 pages.

Futurewei, "50G-PON PSync Discussion," International Telecommunication Union, Study Group 15, Texas, XP044260184, Jan. 9-10, 2019, 7 pages.

Futurewei Technologies, "50G-PON FEC codeword length options," International Telecommunication Union, Study Group 15, SG15-C1733, Geneva, XP044286182, Jan. 27-Feb. 7, 2020, 5 pages.

English Machine Translation International Application Publication WO2014040247, published Mar. 20, 2014, 10 pages.

"10-Gigabit-capable Passive Optical Networks (SB-PON): Transmission Convergence (TC) Layer Specification," ITUT—Series G: Transmission Systems and Media, Digital Systems and Networks, Digital Selections and Digital Line System—Optical Line Systems for Local and Access Networks, G.987.3, Jan. 2014, 146 pages.

Laubach, et al, LDPC Adjustments from Motion #6, May 14, 2018 IEEE 802.3 Interim, Pittsburgh PA, USA, 10 pages.

"Higher Speed Passive Optical Networks: Common Transmission Convergence Layer Specification," G.9804.2 , International Telecommunication Union—Telecommunication Standardization Sector—Series G: Transmission Systems and Media, Digital Systems and Networks-Access Networks-Optical Line Systems for Local and Access Networks, Sep. 2021, 256 pages.

Frank J. Effenberger et al., "The XG-PON System: Cost Effective 10 GB/s Access," Journal of Lightwave Technology, vol. 29, No. 4, Feb. 15, 2011, 7 pages.

* cited by examiner

PASSIVE OPTICAL NETWORK (PON) FRAME DESIGN

CROSS-REFERENCE TO RELATED APPLICATIONS

This is a continuation of Int'l Patent App. No. PCT/CN2020/082829 filed on Apr. 1, 2020, which claims priority to U.S. Prov. Patent App. No. 62/827,598 filed on Apr. 1, 2019, both of which are incorporated by reference.

TECHNICAL FIELD

The disclosed embodiments relate to optical networks in general and PON frame design in particular.

BACKGROUND

Optical networks are networks that use light waves, or optical signals, to carry data. Light sources such as lasers generate the optical signals; modulators modulate the optical signals with data to generate modulated optical signals; and various components transmit, propagate, amplify, receive, and process the modulated optical signals. Optical networks implement various forms of multiplexing to achieve high bandwidths. Optical networks implement data centers, metropolitan networks, PONs, longhauls, and other applications.

SUMMARY

A first aspect relates to a method comprising generating a PON frame comprising a plurality of FEC codewords, the FEC codewords comprise a first codeword, and the first codeword comprises a PSB; and transmitting the PON frame.

A second aspect relates to a method comprising receiving a PON frame comprising a plurality of FEC codewords, the FEC codewords comprise a first codeword, and the first codeword comprises a PSB; and processing the PON frame.

In a first implementation form of the method according to the first aspect as such or the second aspect as such, the PON frame has a duration of about 125 µs.

In a second implementation form of the method according to the first aspect as such, any preceding implementation form of the first aspect, the second aspect as such, or any preceding implementation form of the second aspect, the PON frame comprises 360 FEC codewords with a codeword length of 17,280 bits, resulting in a PON frame length of 6,220,800 bits and a line rate of about 49.7664 G.

In a third implementation form of the method according to the first aspect as such, any preceding implementation form of the first aspect, the second aspect as such, or any preceding implementation form of the second aspect, the PON frame comprises 360 FEC codewords with a codeword length of 17,408 bits, resulting in a PON frame length of 6,266,880 bits and a line rate of 50.13504 G.

In a fourth implementation form of the method according to the first aspect as such, any preceding implementation form of the first aspect, the second aspect as such, or any preceding implementation form of the second aspect, the PON frame comprises 370 FEC codewords with a codeword length of 17,408 bits, resulting in a PON frame length of 6,440,960 bits and a line rate of about 51.52768 G.

In a fifth implementation form of the method according to the first aspect as such, any preceding implementation form of the first aspect, the second aspect as such, or any preceding implementation form of the second aspect, the FEC codewords are LDPC FEC codewords.

In a sixth implementation form of the method according to the first aspect as such, any preceding implementation form of the first aspect, the second aspect as such, or any preceding implementation form of the second aspect, each of the LDPC FEC codewords comprises a payload and a parity check, wherein the LDPC FEC codewords implement LDPC (17,280, 14,208) based on a mother code of LDPC (17,664, 14,592) and shortening 14,592 bits in the payloads by 384 bits to obtain 14,208 bits, and wherein the LDPC FEC codewords provide an about 82.22% FEC rate.

In a seventh implementation form of the method according to the first aspect as such, any preceding implementation form of the first aspect, the second aspect as such, or any preceding implementation form of the second aspect, each of the LDPC FEC codewords comprises a payload and a parity check, wherein the LDPC FEC codewords implement LDPC (17,280, 14,464) based on a mother code of LDPC (17,664, 14,592), shortening 14,592 bits in the payloads by 128 bits to obtain 14,464 bits, and puncturing 3,072 bits in the parity checks by 256 bits to obtain 2,816 bits, and wherein the LDPC FEC codewords provide an about 83.70% FEC rate.

In an eighth implementation form of the method according to the first aspect as such, any preceding implementation form of the first aspect, the second aspect as such, or any preceding implementation form of the second aspect, the PON frame comprises an integer number of FEC codewords.

In an ninth implementation form of the method according to the first aspect as such, any preceding implementation form of the first aspect, the second aspect as such, or any preceding implementation form of the second aspect, the integer is divisible by 2 and 5.

In a tenth implementation form of the method according to the first aspect as such, any preceding implementation form of the first aspect, the second aspect as such, or any preceding implementation form of the second aspect, the integer is 360.

In an eleventh implementation form of the method according to the first aspect as such, any preceding implementation form of the first aspect, the second aspect as such, or any preceding implementation form of the second aspect, the integer is 370.

In a twelfth implementation form of the method according to the first aspect as such, any preceding implementation form of the first aspect, the second aspect as such, or any preceding implementation form of the second aspect, the first codeword is at a beginning of the PON frame.

In a thirteenth implementation form of the method according to the first aspect as such, any preceding implementation form of the first aspect, the second aspect as such, or any preceding implementation form of the second aspect, the PON frame is a downstream PON frame, and wherein the PSB is a PSBd.

In a fourteenth implementation form of the method according to the first aspect as such, any preceding implementation form of the first aspect, the second aspect as such, or any preceding implementation form of the second aspect, the PSB is longer than 192 bits.

In a fifteenth implementation form of the method according to the first aspect as such, any preceding implementation form of the first aspect, the second aspect as such, or any preceding implementation form of the second aspect, the PON frame is an upstream PON frame, and wherein the PSB is a PSBu.

In a sixteenth implementation form of the method according to the first aspect as such, any preceding implementation form of the first aspect, the second aspect as such, or any preceding implementation form of the second aspect, the upstream PON frame provides a line rate that is 1/n of the downstream line rate, wherein n is a positive integer.

In a seventeenth implementation form of the method according to the first aspect as such, any preceding implementation form of the first aspect, the second aspect as such, or any preceding implementation form of the second aspect, the upstream PON frame provides a line rate that is ½ of a corresponding downstream line rate.

In an eighteenth implementation form of the method according to the first aspect as such, any preceding implementation form of the first aspect, the second aspect as such, or any preceding implementation form of the second aspect, the upstream PON frame provides a line rate that is ⅕ of a corresponding downstream line rate.

In a nineteenth implementation form of the method according to the first aspect as such, any preceding implementation form of the first aspect, the second aspect as such, or any preceding implementation form of the second aspect, the PSBu comprises a preamble, wherein the preamble comprises a pattern that is repeated a number of times, and wherein the pattern is longer than 64 bits.

In a twentieth implementation form of the method according to the first aspect as such, any preceding implementation form of the first aspect, the second aspect as such, or any preceding implementation form of the second aspect, the pattern is 128 bits.

A third aspect relates to an apparatus configured to perform the first aspect as such, any preceding implementation form of the first aspect, the second aspect as such, or any preceding implementation form of the second aspect.

In a first implementation form of the apparatus according to the third aspect as such, the apparatus is an OLT.

In a second implementation form of the apparatus according to the third aspect as such, the apparatus is an ONU.

A fourth aspect relates to a computer program product comprising computer-executable instructions stored on a non-transitory medium that when executed by a processor cause an apparatus to perform the first aspect as such, any preceding implementation form of the first aspect, the second aspect as such, or any preceding implementation form of the second aspect.

Any of the above embodiments may be combined with any of the other above embodiments to create a new embodiment. These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The following abbreviations apply:
ASIC: application-specific integrated circuit
BCH: Bose-Chaudhuri-Hocquenghem
CO: central office
CPU: central processing unit
DSP: digital signal processor
EO: electrical-to-optical
FEC: forward error correction
FPGA: field-programmable gate array
G: gigabits per second
HEC: hybrid error correction
ID: identifier
ITU-T: International Telecommunication Union Telecommunication Standardization Sector
LDPC: low-density parity check
ODN: optical distribution network
OE: optical-to-electrical
OLT: optical line terminal
ONU: optical network unit
PHY: physical interface
PON: passive optical network
PSB: physical synchronization block
PSBd: PSB for downstream
PSBu: PSB for upstream
PSync: physical synchronization sequence
P2MP: point-to-multipoint
RAM: random-access memory
RF: radio frequency
ROM: read-only memory
RX: receiver unit
SFC: superframe counter
SRAM: static RAM
TCAM: ternary content-addressable memory
TX: transmitter unit
μs: microsecond(s).

Figure 1:
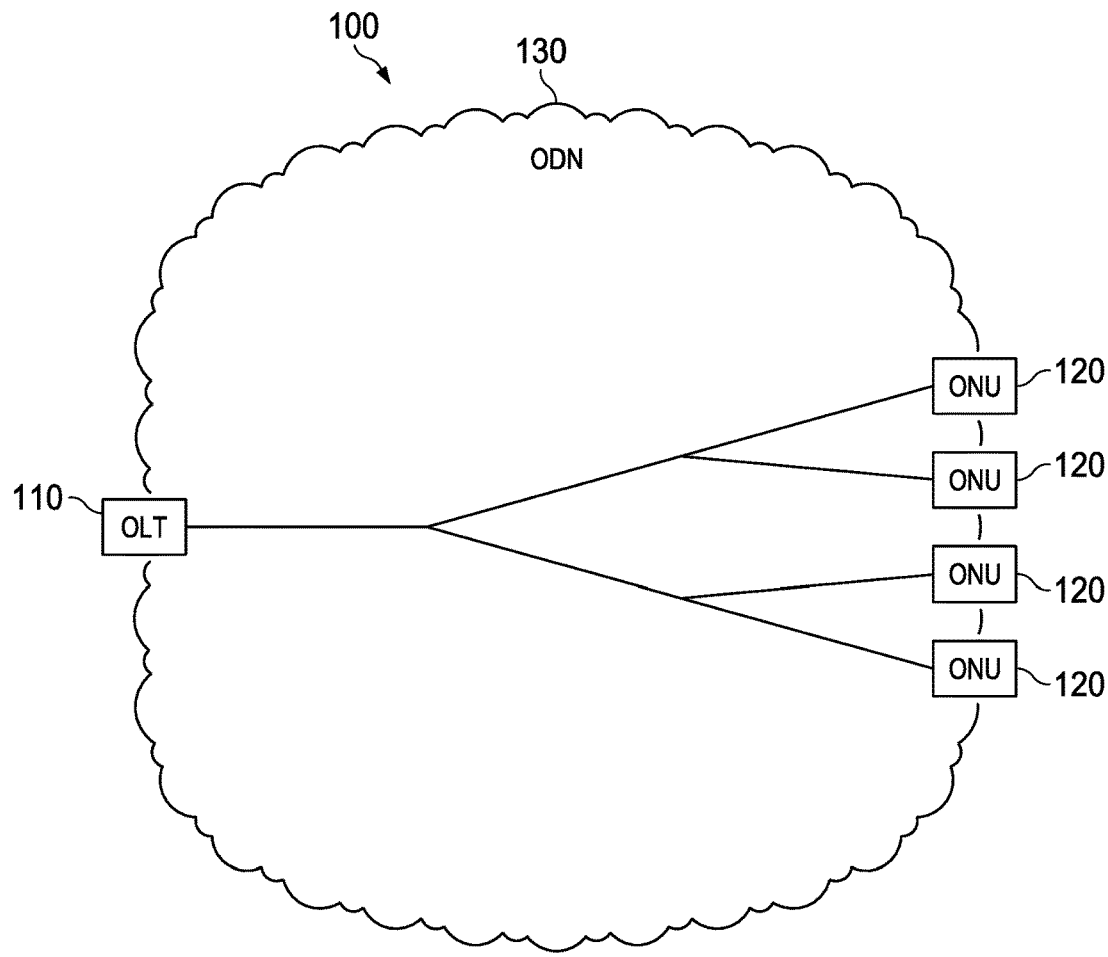
FIG. 1 is a schematic diagram of a PON.

FIG. 1 is a schematic diagram of a PON 100. The PON 100 comprises an OLT 110, ONUs 120, and an ODN 130 that couples the OLT 110 to the ONUs 120. The PON 100 is a communications network that may not require active components to distribute data between the OLT 110 and the ONUs 120. Instead, the PON 100 may use passive optical components in the ODN 130 to distribute data between the OLT 110 and the ONUs 120.

The OLT 110 communicates with another network and the ONUs 120. Specifically, the OLT 110 is an intermediary between the other network and the ONUs 120. For instance, the OLT 110 forwards data received from the other network to the ONUs 120 and forwards data received from the ONUs 120 to the other network. The OLT 110 comprises a transmitter and a receiver. When the other network uses a network protocol that is different from the protocol used in the PON 100, the OLT 110 comprises a converter that converts the network protocol to the PON protocol and vice versa. The OLT 110 is typically located at a central location such as a CO, but it may also be located at other suitable locations.

The ODN 130 is a data distribution network that comprises optical fiber cables, couplers, splitters, distributors, and other suitable components. The components include passive optical components that do not require power to distribute signals between the OLT 110 and the ONUs 120. The ODN 130 extends from the OLT 110 to the ONUs 120 in a branching configuration as shown, but the ODN 130 may be configured in any other suitable P2MP configuration.

The ONUs 120 communicate with the OLT 110 and customers and act as intermediaries between the OLT 110 and the customers. For instance, the ONUs 120 forward data from the OLT 110 to the customers and forward data from the customers to the OLT 110. The ONUs 120 comprise optical transceivers that receive optical signals from the OLT 110, convert the optical signals into electrical signals, and provide the electrical signals to the customers. The transceivers also receive electrical signals from the customers, convert the electrical signals into optical signals, and transmit the optical signals to the OLT 110. ONUs 120 and ONTs are similar, and the terms may be used interchangeably. The ONUs 120 are typically located at distributed locations such as customer premises, but they may also be located at other suitable locations.

The PON 100 may be compatible with various standards that provide various line rates. For instance, ITU-T G.987.3, January 2014 ("G.987.3"), provides a 10G line rate, and other standards provide 1G, 12.5G, 25G, 50G, and other line rates. G.987.3 specifies that the OLT 110 and the ONUs 120 communicate with each other using PON frames with a length of 125 µs. That length applies to other standards as well. One can multiply the 125 µs length of the PON frame by a respective line rate to obtain a number of bits per PON frame. For instance, a 10G line rate provides 1,244,160 bits per PON frame, and a 50G line rate provides 6,220,800 bits per PON frame.

In addition, the standards typically divide the PON frames into codewords, which may be later processed by a parity check matrix. However, after dividing the PON frames into codewords, the standards may be left with additional unused bits. There is therefore a desire for PON frame designs that judiciously use bits in a way that is scalable to the various line rates.

Disclosed herein are embodiments for PON frame design. The embodiments provide for PON frames comprising first codewords. The first codewords comprise PSBs. The embodiments provide various advantages. First, the embodiments judiciously use bits in a way that is scalable to several key line rates. Second, the lengths of the PSBs may be adjusted, and the number of the codewords and the lengths of the codewords are independent of the lengths of the PSBs. Third, the PON frames comprise integer numbers of codewords regardless of their associated line rates. Fourth, the lengths of the codewords are suitable for parallel implementation. Though PON frames are discussed, the same principles apply to optical networks other than PONs and to data structures other than frames.

Figure 2:
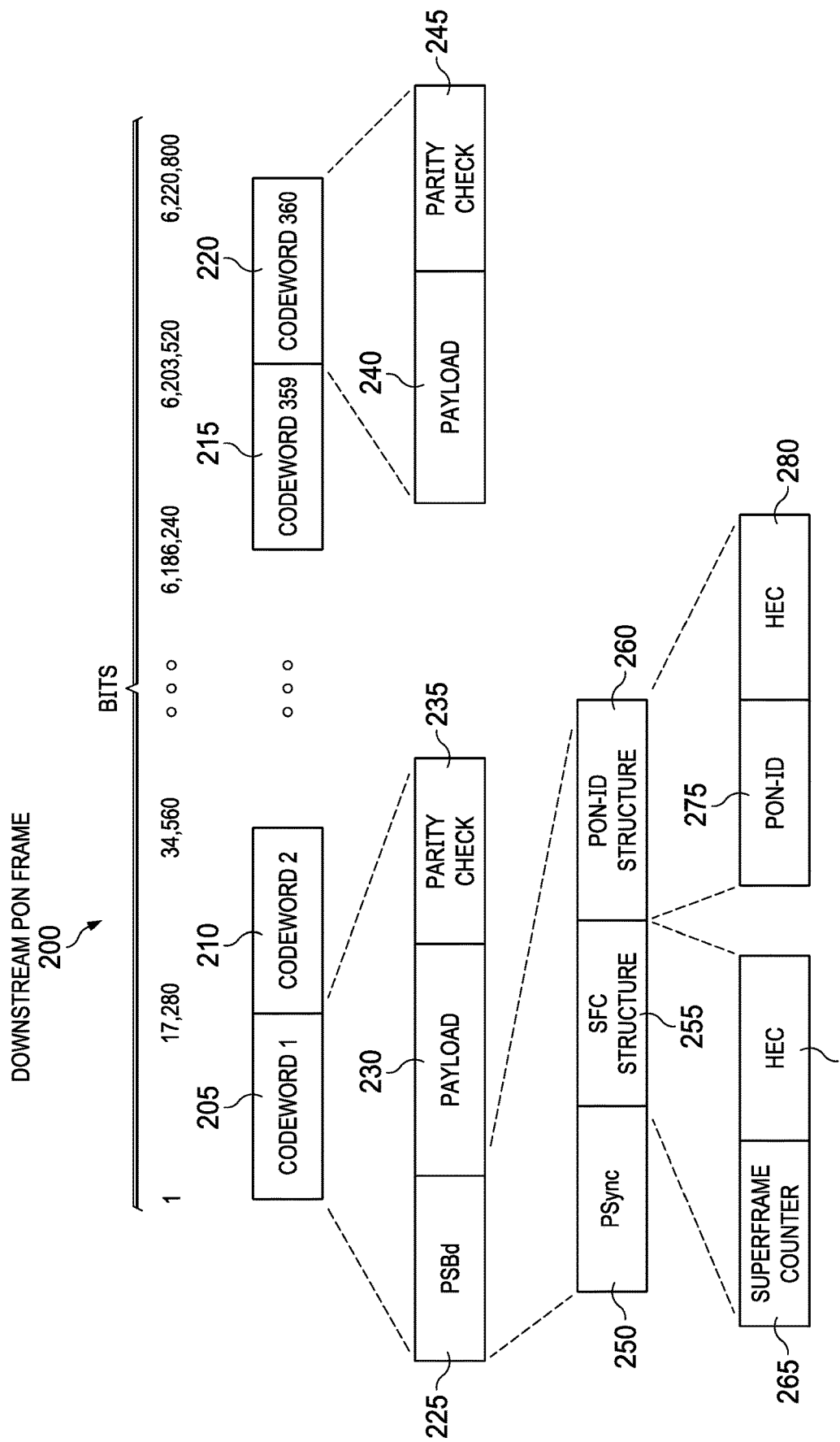
FIG. 2 is a schematic diagram of a downstream PON frame according to an embodiment of the disclosure.

FIG. 2 is a schematic diagram of a downstream PON frame 200 according to an embodiment of the disclosure. Downstream refers to a direction from the OLT 110 to the ONUs 120. The downstream PON frame 200 may provide a 50G line rate.

The downstream PON frame 200 comprises codeword 1 205, codeword 2 210, codeword 359 215, and codeword 360 220. The ellipsis between codeword 2 210 and codeword 239 215 indicates the presence of codewords 3-358. Each codeword 205-220 is 17,280 bits, or has a codeword length of 17,280 bits, so that codeword 1 205 is bits 1-17,280; codeword 2 210 is bits 17,281-34,560; codeword 359 215 is bits 6,186,241-6,203,520; and codeword 360 220 is bits 6,203,521-6,220,800. The codewords 205-220 may implement FEC and therefore be FEC codewords.

Codeword 1 205 comprises a PSBd 225, a payload 230, and a parity check 235. The PSBd 225 is adjustable in length and is described below. The payload 230 comprises data, for instance, user data, that the OLT 110 desires to pass to the ONUs 120. The parity check 235 comprises bits that ensure accurate data transmission. As an example, the PSBd 225 is 256 bits, the payload 230 is 13952 (14,208−256) bits, and the parity check 235 is 3,072 bits. In that case, the 256 bits of the PSBd 225 are extended from the 192 bits allowed in G.987.3. Codeword 360 220 comprises a payload 240 similar to the payload 230 in codeword 1 205 and comprises a parity check 245 similar to the parity check 235 in codeword 1 205. However, codeword 360 220 does not comprise a PSBd similar to the PSBd 225 in codeword 1 205. Likewise, none of the remaining codewords 210-215 comprise a PSBd. Thus, in the downstream PON frame 200, only codeword 1 205 comprises the PSBd 225 and the remaining codewords 210-220 are independent of a PSBd, so the PSBd 225 is the only PSBd or PSB in the downstream PON frame 200. That is different from other approaches in which the PSBd 225 is outside codeword 1 205 and precedes all of the codewords 205-220.

The PSBd 225 comprises a PSync 250, an SFC structure 255, and a PON-ID structure 260. The PSync 250 comprises a fixed 64-bit pattern that the ONUs 120 use to achieve alignment at a downstream PHY boundary. The SFC structure 255 is described below. The PON-ID 260 structure is described below. As an example, the PSync 250 is 128 bits, the SFC structure 255 is 64 bits, and the PON-ID structure 260 is 64 bits. In that case, the 128 bits of the PSync 250 are extended from the 64 bits allowed in G.987.3.

The SFC structure 255 comprises a superframe counter 265 and an HEC field 270. The superframe counter 265 comprises a value that is incremented by one with respect to a previous downstream PON frame. When the value reaches its maximum, meaning all ones, the OLT 110 sets it to 0 in a following downstream PON frame. The HEC field 270 is a combination of a BCH code operating on the 63 initial bits of the SFC structure 255 and a single parity bit. As an example, the superframe counter 265 is 51 bits and the HEC field 270 is 13 bits.

The PON-ID structure 260 comprises a PON-ID 275 and an HEC field 280. The PON-ID 275 is set by the OLT 110 at its discretion, and its default is all zeros. The HEC field 280 is a combination of a BCH code operating on the 63 initial bits of the PON-ID structure 260 and a single parity bit. As an example, the PON-ID 275 is 51 bits and the HEC field 280 is 13 bits.

First, the downstream PON frame 200 comprises 360 codewords 205-220 and each codeword 205-220 is 17,280 bits. So long as the PSBd 225 does not increase dramatically, for instance beyond 17,280 bits less a number of bits needed for the payload 230 and a number of bits needed for the parity check 235, the number of codewords 205-220 and the length of the codewords 205-220 are independent of a length of the PSBd 225. This is because the PSBd 225 is inside codeword 1 205, so that increasing or decreasing its length does not affect a number of bits available for the codewords 205-220. In contrast, if the PSBd 225 were outside codeword 1 205, for instance if the PSBd 225 preceded codeword 1 205, then increasing its size would decrease a number of bits available for the codewords 205-220 and thus decrease a number of codewords 205-220 or their lengths.

Second, the downstream PON frame 200 comprises an integer number of codewords 205-220 regardless of its associated line rate. For instance, as shown, if the downstream PON frame 200 implements a 50G line rate, then the downstream PON frame 200 comprises 360 codewords 205-220 of 17,280 bits each. However, if the downstream PON frame 200 implements a 10G line rate, then the downstream PON frame 200 comprises 72 codewords of 17,280 bits each. If the downstream PON frame 200 implements a 12.5G line rate, then the downstream PON frame 200 comprises 90 codewords of 17,280 bits each. If the downstream PON frame 200 implements a 25G line rate, then the downstream PON frame 200 comprises 180 codewords of 17,280 bits each. The numbers 72, 90, 180, and 360 are all integers, where 72 is 360/5, 90 is 360/4, and 180 is 360/2.

Third, the 17,280-bit length of the codewords 205-220 is suitable for parallel implementation because 17,280 is a multiple of 128. Parallel implementation is the ability to separate high-speed data into multiple parallel paths for processing. Each parallel path may then run at an acceptably low speed.

Figure 3:
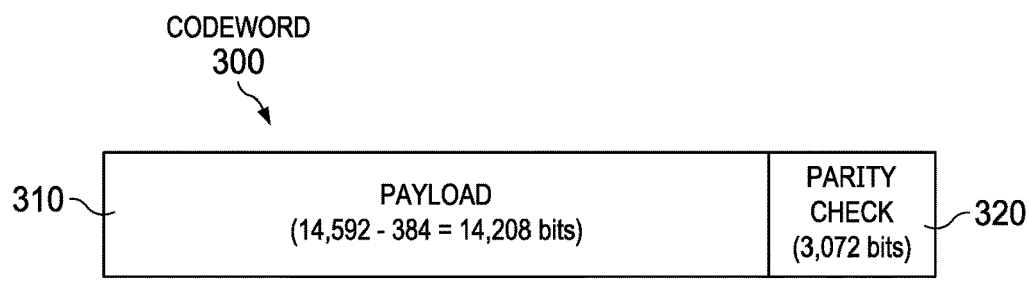
FIG. 3 is a schematic diagram of a codeword according to an embodiment of the disclosure.

FIG. 3 is a schematic diagram of a codeword 300 according to an embodiment of the disclosure. The codeword 300 may implement the codewords 210-220 in the downstream PON frame 200 in FIG. 2. The codeword 300 comprises a payload 310 and a parity check 320.

The codeword 300 is based on a mother code for a 25G line rate as described in Mark Laubach, et al., "LDPC Adjustments from Motion #6, Chicago," May 14, 2018. The mother code is LDPC (17,664, 14,592), which indicates LDPC codewords comprising 17,664 total bits; 14,592 payload bits; and thus 3,072 parity check bits. However, the codeword 300 shortens the 14,592 payload bits of the mother code by 384 bits to obtain 14,208 bits for the payload 310; thus also shortens the 17,664 total bits by 384 bits to obtain 17,280 bits for the codeword 300; and maintains 3,072 bits for the parity check 320. Thus, the codeword 300 implements LDPC (17,280, 14,208). Dividing 14,208 by 17,280 yields an 82.22% FEC rate. LDPC is a type of FEC, so LDPC codewords, or codewords implementing LDPC FEC, may be referred to as LDPC FEC codewords.

Figure 4:
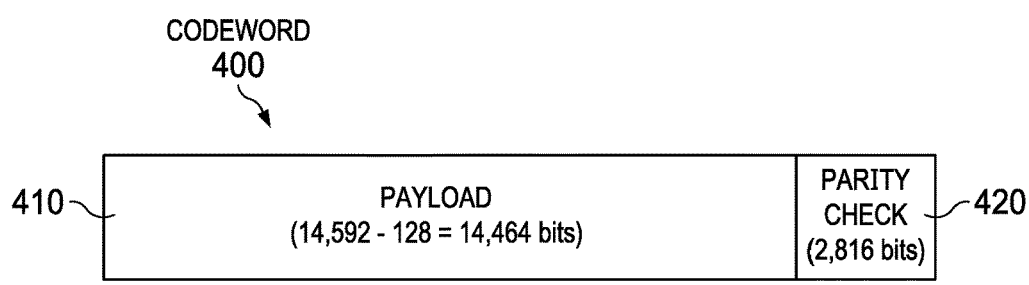
FIG. 4 is a schematic diagram of a codeword according to another embodiment of the disclosure.

FIG. 4 is a schematic diagram of a codeword 400 according to another embodiment of the disclosure. The codeword 400 may implement the codewords 210-220 in the downstream PON frame 200 in FIG. 2. The codeword 400 comprises a payload 410 and a parity check 420.

The codeword 400 is based on the LDPC (17,664, 14,592) mother code described above. However, the codeword 400 shortens the 14,592 payload bits of the mother code by 128 bits to obtain 14,464 bits for the payload 410, punctures the 3,072 parity check bits of the mother code by 256 bits to obtain 2,816 bits for the parity check 420, and thus also shortens the 17,664 total bits by 384 bits (128 bits+256 bits) to obtain 17,280 bits for the codeword 400. To puncture means to take from and therefore shorten. Thus, the codeword 400 implements LDPC (17,280, 14,464). Dividing 14,464 by 17,280 yields an 83.70% FEC rate.

The same concepts above may apply to other codeword schemes. For instance, it can be assumed that the downstream PON frame 200 retains a length of 125 µs, the number of codewords is an integer number for several key line rates and thus ends in 0 in order to be divisible by 2 and 5, and the codewords comprise a number of bits that can be multiplied by 256 in order to implement the LDPC (17,664, 14,592) mother code. By having an integer number of codewords for several key line rates, the schemes are scalable for those line rates. Table 1 shows three codeword schemes that follow those assumptions.

TABLE 1

Codeword schemes

| | Scheme 1 | Scheme 2 | Scheme 3 |
|---|---|---|---|
| Number of codewords: | 360 | 360 | 370 |
| Number of codeword blocks: | 67.5 | 68 | 68 |
| Size of blocks (bits): | 256 | 256 | 256 |
| Line rate (G): | 49.7664 | 50.13504 | 51.52768 |
| FEC rate 1 (%): | 82.22 | 82.35 | 82.35 |
| Payload rate 1 (G): | 40.92 | 41.29 | 42.43 |
| FEC rate 2 (%): | 83.70 | 83.82 | 83.82 |
| Payload rate 2 (G): | 41.65 | 42.02 | 43.19 |

Scheme 1 demonstrates implementation of the codewords 300, 400 in the downstream PON frame 200. Specifically, the downstream PON frame 200 comprises 360 codewords 205-220. Each codeword 205-220 may comprise 67.5 codeword blocks of 256 bits each, which yields 17,280 bits for each codeword 205-220 and 17,280×360=6,220,800 bits for the downstream PON frame 200, or a PON frame length of 6,220,800 bits. The resulting line rate is 6,220,800 bits/125 µs=49.7664G, which is the actual line rate of 50G. FEC rate 1 refers to the codeword 300, which implements LDPC (17,280, 14,208) and yields an 82.22% FEC rate. Corresponding payload rate 1 is the line rate×FEC rate 1, or 49.7664G×82.22%=40.92G. FEC rate 2 refers to the codeword 400, which implements LDPC (17,280, 14,464) and yields an 83.70% FEC rate. Corresponding payload rate 2 is the line rate×FEC rate 2, or 49.7664G×83.70%=41.65G.

Scheme 2 is similar to scheme 1. However, instead of 67.5 codeword blocks like in scheme 1, scheme 2 uses 68 codeword blocks, which yields 17,408 bits for each codeword and 6,266,880 bits for a downstream PON frame. The resulting line rate is 50.13504G, the resulting FEC rate 1 is 82.35%, the resulting payload rate 1 is 41.29G, the resulting FEC rate 2 is 83.82%, and the resulting payload rate 2 is 42.02G.

Scheme 3 is similar to scheme 2. However, instead of 360 codewords like in scheme 2, scheme 3 uses 370 codewords, which yields 6,440,960 bits for a downstream PON frame. The resulting line rate 51.52768G, the resulting FEC rate 1 is 82.35%, the resulting payload rate 1 is 42.43G, the resulting FEC rate 2 is 83.82%, and the resulting payload rate 2 is 43.19G.

In another scheme, the codewords 205-220 implement LDPC (17,280, 14,592) based on the LDPC (17,664, 14,592) mother code and puncturing 3,072 bits in the parity check bits by 384 bits to obtain 2,688 bits. The resulting FEC rate is about 84.44%.

Figure 5:
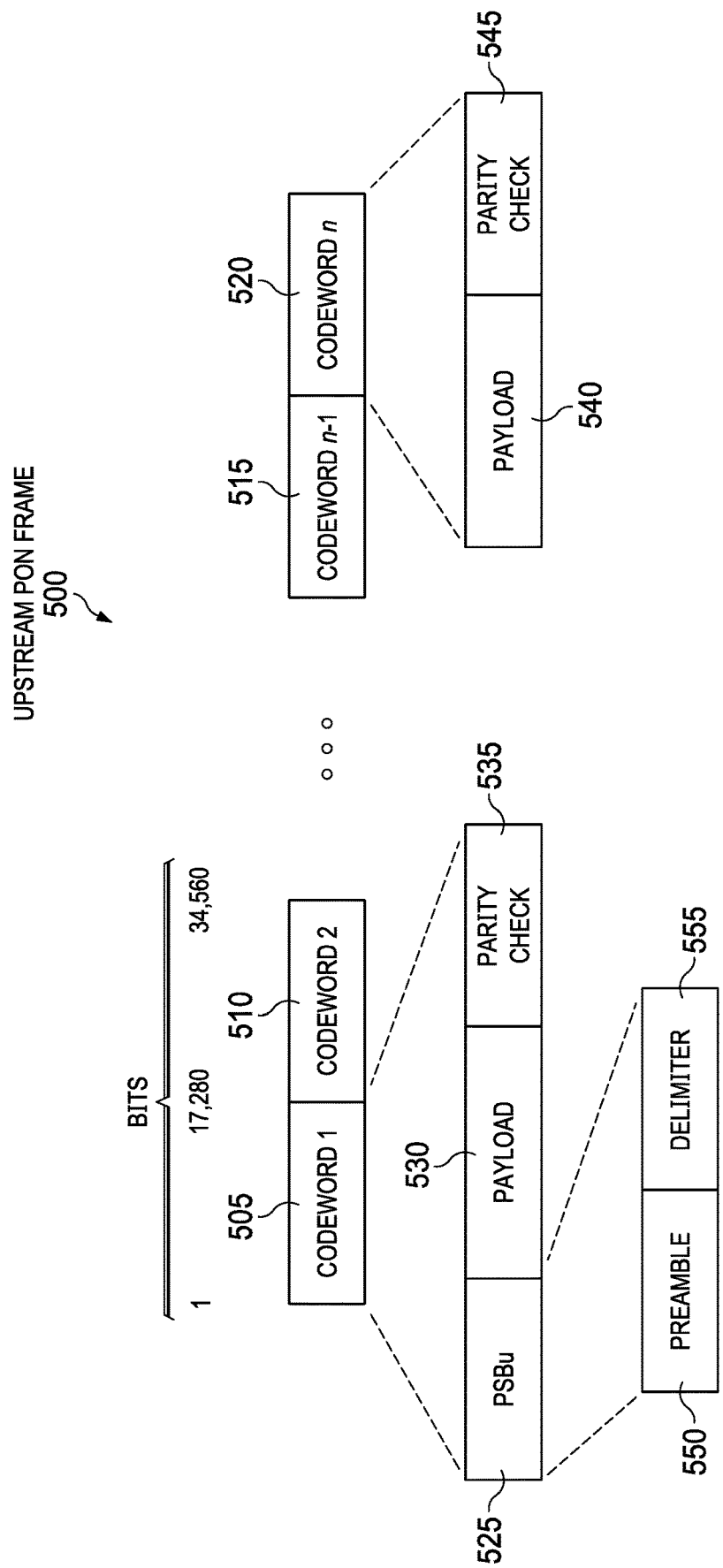
FIG. 5 is a schematic diagram of an upstream PON frame according to an embodiment of the disclosure.

FIG. 5 is a schematic diagram of an upstream PON frame 500 according to an embodiment of the disclosure. Upstream refers to a direction from the ONUs 120 to the OLT 110. The upstream PON frame 500 may provide a line rate that is 1/n of a corresponding downstream line rate, where n is a positive integer. For instance, the upstream PON frame 500 provides a line rate that is ½ of the downstream line rate or ⅕ of the downstream line rate.

The upstream PON frame 500 comprises codeword 1 505, codeword 2 510, codeword n−1 515, and codeword n 520. The ellipsis between codeword 2 510 and codeword n−1 515 indicates the presence of codewords 3-(n−2). Each codeword 505-520 is 17,280 bits so that codeword 1 505 is bits 1-17,280; codeword 2 510 is bits 17,281-34,560; and so on. The codewords 505-520 may implement FEC and therefore be FEC codewords.

Codeword 1 505 comprises a PSBu 525, a payload 530, and a parity check 535. The PSBu 525 is adjustable in length and is described below. The payload 530 comprises data, for instance, user data, that an ONU 120 desires to pass to the OLT 110. The parity check 535 comprises bits that ensure accurate data transmission. As an example, the PSBu 525 is m bits; the payload 530 is 14208−m bits; and the parity check 535 is 3,072 bits. Codeword n 520 comprises a payload 540 similar to the payload 530 in codeword 1 505 and comprises a parity check 545 similar to the parity check 535 in codeword 1 505. However, codeword n 520 does not comprise a PSBu similar to the PSBu 525 in codeword 1 505. Likewise, none of the remaining codewords 510-515 comprise a PSBu. Thus, in the upstream PON frame 500, only codeword 1 505 comprises the PSBu 525 and the remaining codewords 510-520 are independent of a PSBu, so the PSBu 525 is the only PSBu or PSB in the upstream PON frame 500. That is different from other approaches in which the PSBu 525 is outside codeword 1 505 and precedes all of the codewords 505-520.

The PSBu 525 comprises a preamble 550 and a delimiter 555. The preamble 550 comprises a pattern that is repeated a number of times. The codeword 1 505 protects the preamble 550. The pattern is adjustable in length, and vendors may vary the pattern. As an example, the pattern is 64 bits and is repeated 31 times, so the preamble 550 is 64×31=1,984 bits. In that case, the 1,984 bits of the preamble 550 are consistent with G.987.3. Together, the preamble 550 and the delimiter 555 comprise data for the OLT 110 to determine a presence of a PHY burst from the ONU 120, delineate the PHY burst, and determine a signal clock in order to correctly recover a transmitted signal.

The upstream PON frame 500 may have characteristics similar to the downstream PON frame 200. For instance, first, the number of codewords 505-520 and the length of the codewords 505-520 are independent of a length of the PSBu 525. Second, the upstream PON frame 500 comprises an integer number of codewords 505-520 regardless of its associated line rate. Third, the length of the codewords 505-520 is suitable for parallel implementation.

Figure 6:
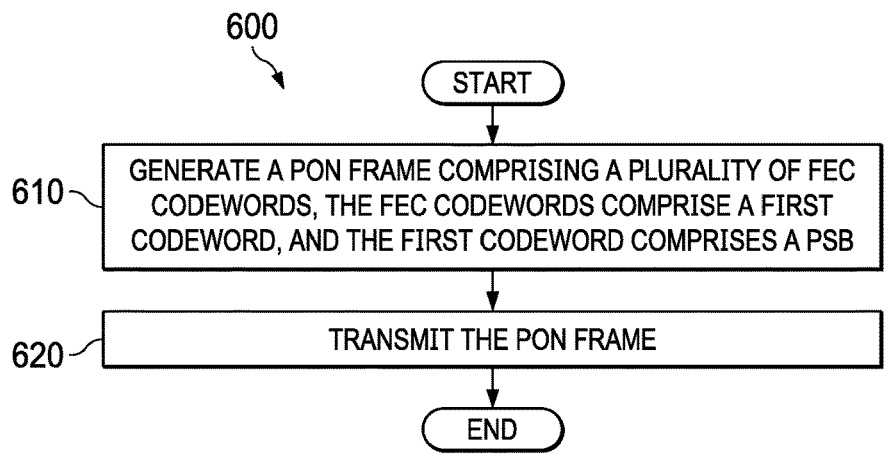
FIG. 6 is a flowchart illustrating a method of PON frame communication according to an embodiment of the disclosure.

FIG. 6 is a flowchart illustrating a method 600 of PON frame communication according to an embodiment of the disclosure. The OLT 110 implements, or the ONUs 120 implement, the method 600. At step 610, a PON frame comprising a plurality of FEC codewords is generated. The FEC codewords comprise a first codeword, and the first codeword comprises a PSB. In a first example, the PON frame is the downstream PON frame 200, the codewords are the codewords 205-220, the first codeword is codeword 1 205, and the PSB is the PSBd 225. In a second example, the PON frame is the upstream PON frame 500, the codewords are the codewords 505-520, the first codeword is codeword 1 505, and the PSB is the PSBu 525. Finally, at step 620, the PON frame is transmitted. In a first example, the OLT 110 transmits the downstream PON frame 200 to an ONU 120. In a second example, an ONU 120 transmits the upstream PON frame 500 to the OLT 110.

Figure 7:
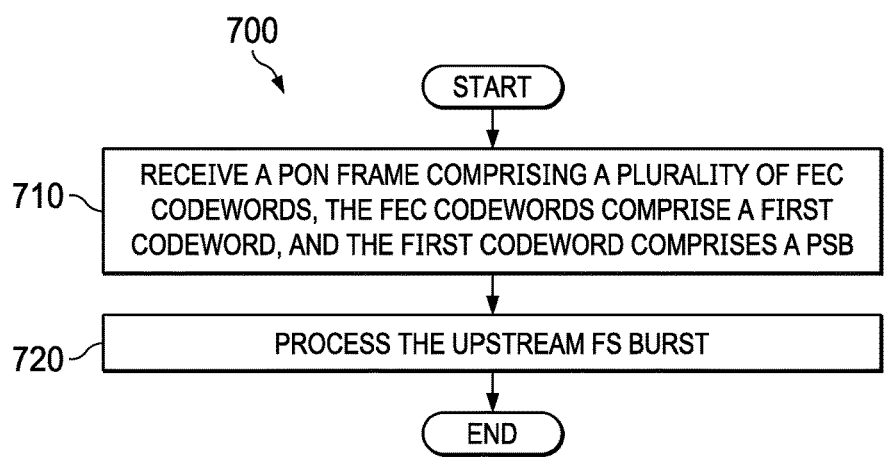
FIG. 7 is a flowchart illustrating a method of PON frame communication according to another embodiment of the disclosure.

FIG. 7 is a flowchart illustrating a method 700 of PON frame communication according to another embodiment of the disclosure. The OLT 110 implements, or the ONUs 120 implement, the method 700. At step 710, a PON frame comprising a plurality of FEC codewords is received. The FEC codewords comprise a first codeword, and the first codeword comprises a PSB. In a first example, the PON frame is the downstream PON frame 200, the codewords are the codewords 205-220, the first codeword is codeword 1 205, and the PSB is the PSBd 225. In a second example, the PON frame is the upstream PON frame 500, the codewords are the codewords 505-520, the first codeword is codeword 1 505, and the PSB is the PSBu 525. Finally, at step 720, the PON frame is processed.

Figure 8:
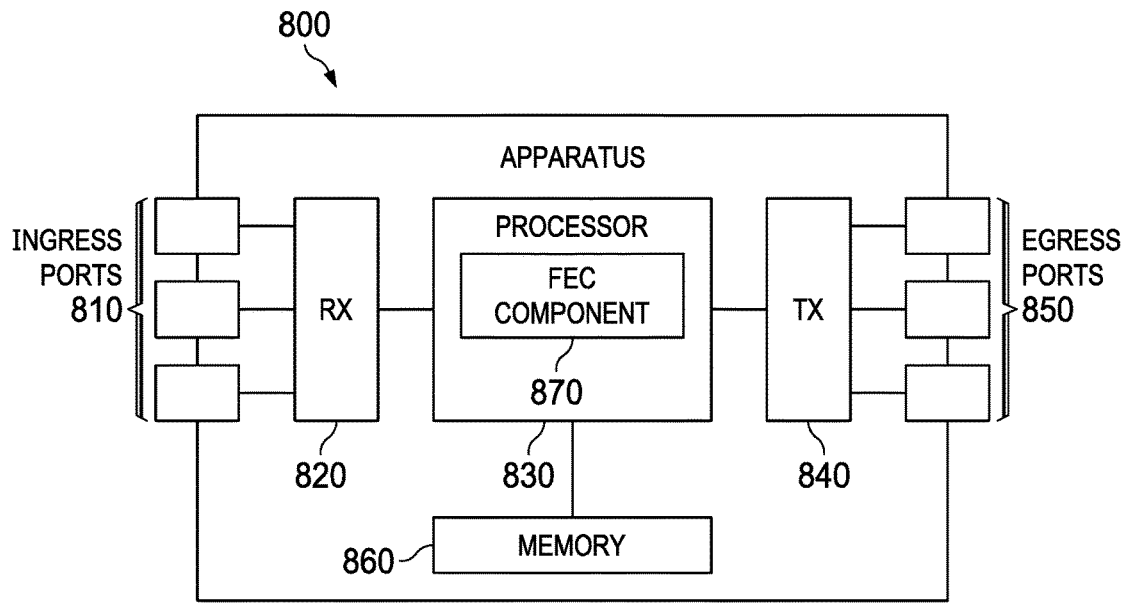
FIG. 8 is a schematic diagram of an apparatus according to an embodiment of the disclosure.

FIG. 8 is a schematic diagram of an apparatus 800 according to an embodiment of the disclosure. The apparatus 800 may implement all or part of the disclosed embodiments, for instance, the OLT 110 and the ONUs 120. The apparatus 800 comprises ingress ports 810 and an RX 820 to receive data; a processor, logic unit, baseband unit, or CPU 830 to process the data; a TX 840 and egress ports 850 to transmit the data; and a memory 860 to store the data. The apparatus 800 may also comprise OE components, EO components, or RF components coupled to the ingress ports 810, the RX 820, the TX 840, and the egress ports 850 to provide ingress or egress of optical signals, electrical signals, or RF signals.

The processor 830 is any combination of hardware, middleware, firmware, or software. The processor 830 comprises any combination of one or more CPU chips, cores, FPGAs, ASICs, or DSPs. The processor 830 communicates with the ingress ports 810, the RX 820, the TX 840, the egress ports 850, and the memory 860. The processor 830 comprises an FEC component 870, which implements the disclosed embodiments. The inclusion of the FEC component 870 therefore provides a substantial improvement to the functionality of the apparatus 800 and effects a transformation of the apparatus 800 to a different state. Alternatively, the memory 860 stores the FEC component 870 as instructions, and the processor 830 executes those instructions.

The memory 860 comprises any combination of disks, tape drives, or solid-state drives. The apparatus 800 may use the memory 860 as an over-flow data storage device to store programs when the apparatus 800 selects those programs for execution and to store instructions and data that the apparatus 800 reads during execution of those programs, for instance as a computer program product. The memory 860 may be volatile or non-volatile and may be any combination of ROM, RAM, TCAM, or SRAM. The memory 860 in some embodiments stores the computer instructions comprising the FEC component 870.

A computer program product may comprise computer-executable instructions stored on a non-transitory medium, for instance the memory 860, that when executed by a processor, for instance the processor 830, cause an apparatus to perform any of the embodiments.

In some examples, where the apparatus 800 comprises an OLT, the processor 830 executes the FEC component 870 to generate a PON frame comprising a plurality of FEC codewords, the FEC codewords comprise a first codeword, and the first codeword comprises a PSB, and the processor 830 executes the FEC component 870 to transmit the PON frame.

In some examples, where the apparatus 800 comprises an ONU, the processor 830 executes the FEC component 870 to receive a PON frame comprising a plurality of FEC codewords, the FEC codewords comprise a first codeword, and the first codeword comprises a PSB, and the processor 830 executes the FEC component 870 to process the PON frame.

In some examples, where the apparatus 800 comprises an OLT, the apparatus 800 includes a frame module generating a PON frame comprising a plurality of FEC codewords, the FEC codewords comprise a first codeword, and the first codeword comprises a PSB, and a transmitter module transmitting the PON frame. In some embodiments, the apparatus 800 may include other or additional modules for performing any one of or combination of steps described in the embodiments. Further, any of the additional or alternative embodiments or aspects of the method, as shown in any of the figures or recited in any of the claims, are also contemplated to include similar modules.

In some examples, where the apparatus 800 comprises an ONU, the apparatus 800 includes a receiver module receiving a PON frame comprising a plurality of FEC codewords, the FEC codewords comprise a first codeword, and the first codeword comprises a PSB, and a processor module processing the PON frame. In some embodiments, the apparatus 800 may include other or additional modules for performing any one of or combination of steps described in the embodiments. Further, any of the additional or alternative embodiments or aspects of the method, as shown in any of the figures or recited in any of the claims, are also contemplated to include similar modules.

In an example embodiment, the apparatus 800 includes a frame generation module generating a PON frame comprising a plurality of FEC codewords, the FEC codewords comprise a first codeword, and the first codeword comprises a PSB, and a frame transmission module transmitting the PON frame. In some embodiments, the apparatus 800 may include other or additional modules for performing any one of or combination of steps described in the embodiments. Further, any of the additional or alternative embodiments or aspects of the method, as shown in any of the figures or recited in any of the claims, are also contemplated to include similar modules.

In an example embodiment, the apparatus 800 includes a frame reception module receiving a PON frame comprising a plurality of FEC codewords, the FEC codewords comprise a first codeword, and the first codeword comprises a PSB, and a frame processing module processing the PON frame. In some embodiments, the apparatus 800 may include other or additional modules for performing any one of or combination of steps described in the embodiments. Further, any of the additional or alternative embodiments or aspects of the method, as shown in any of the figures or recited in any of the claims, are also contemplated to include similar modules.

The term "about" means a range including±10% of the subsequent number unless otherwise stated. While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled may be directly coupled or may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method comprising:
generating a downstream passive optical network (PON) frame comprising only an integer number of forward error correction (FEC) codewords, the FEC codewords comprise a first codeword, and the first codeword includes a physical synchronization block for downstream (PSBd); and
transmitting the PON frame.

2. The method of claim 1, wherein the integer is divisible by 2 and 5.

3. The method of claim 1, wherein the FEC codewords have a codeword length of 17,280 bits.

4. The method of claim 1, wherein the FEC codewords are low-density parity check (LDPC) FEC codewords.

5. The method of claim 4, wherein the LDPC FEC codewords are based on a mother code of LDPC (17,664, 14,592).

6. The method of claim 4, wherein each of the LDPC FEC codewords comprises a payload and a parity check, wherein the LDPC FEC codewords implement LDPC (17,280, 14,208) based on a mother code of LDPC (17,664, 14,592) and shortening 14,592 bits in the payloads by 384 bits to obtain 14,208 bits, and wherein the LDPC FEC codewords provide an about 82.22% FEC rate.

7. The method of claim 4, wherein each of the LDPC FEC codewords comprises a payload and a parity check, wherein the LDPC FEC codewords implement LDPC (17,280, 14,464) based on a mother code of LDPC (17,664, 14,592), shortening 14,592 bits in the payloads by 128 bits to obtain 14,464 bits, and puncturing 3,072 bits in each parity check by 256 bits to obtain 2,816 bits, and wherein the LDPC FEC codewords provide an about 83.70% FEC rate.

8. The method of claim 1, wherein the PON frame has a duration of about 125 microseconds (μs).

9. The method of claim 1, wherein for a 49.7664 gigabits per second (Gbit/s) line rate, the codewords implement a low-density parity check (LDPC) with 17,280 total bits, and wherein the downstream PON frame comprises 360 FEC codewords.

10. The method of claim 1, wherein for a 49.7664 gigabits per second (Gbit/s) line rate, the codewords implement a low-density parity check (LDPC) with 14,592 payload bits, and wherein the downstream PON frame comprises 360 FEC codewords.

11. The method of claim 1, wherein the first codeword is at a beginning of the downstream PON frame.

12. A method comprising:
receiving a downstream passive optical network (PON) frame comprising only an integer number of forward error correction (FEC) codewords, the FEC codewords comprise a first codeword, and the first codeword includes a physical synchronization block for downstream (PSBd); and
processing the PON frame.

13. The method of claim 12, wherein the FEC codewords have a codeword length of 17,280 bits.

14. The method of claim 12, wherein the FEC codewords are low-density parity check (LDPC) FEC codewords.

15. The method of claim 14, wherein the LDPC FEC codewords are based on a mother code of LDPC (17,664, 14,592).

16. An apparatus comprising:
   a memory configured to store instructions; and
   one or more processors in communication with the memory, wherein the one or more processors execute the instructions to cause the apparatus to:
      generate a downstream passive optical network (PON) frame comprising only an integer number of forward error correction (FEC) codewords, the FEC codewords comprise a first codeword, and the first codeword includes a physical synchronization block for downstream (PSBd); and
      transmit the PON frame.

17. The apparatus of claim 16, wherein the FEC codewords have a codeword length of 17,280 bits.

18. The apparatus of claim 16, wherein the integer is divisible by 2 and 5.

19. The apparatus of claim 16, wherein the FEC codewords are low-density parity check (LDPC) FEC codewords.

20. The apparatus of claim 19, wherein the LDPC FEC codewords are based on a mother code of LDPC (17,664, 14,592).

* * * * *